US008898527B2

(12) United States Patent
Kumar et al.

(10) Patent No.: US 8,898,527 B2
(45) Date of Patent: Nov. 25, 2014

(54) AT-SPEED SCAN TESTING OF CLOCK DIVIDER LOGIC IN A CLOCK MODULE OF AN INTEGRATED CIRCUIT

(71) Applicant: LSI Corporation, San Jose, CA (US)

(72) Inventors: Priyesh Kumar, Pune (IN); Komal N. Shah, Mumbai (IN); Ramesh C. Tekumalla, Breinigsville, PA (US)

(73) Assignee: LSI Corporation, Milpitas, CA (US)

( * ) Notice: Subject to any disclaimer, the term of this patent is extended or adjusted under 35 U.S.C. 154(b) by 115 days.

(21) Appl. No.: 13/744,563

(22) Filed: Jan. 18, 2013

(65) Prior Publication Data

US 2014/0208175 A1    Jul. 24, 2014

(51) Int. Cl.
*G01R 31/28* (2006.01)
*G01R 31/3185* (2006.01)

(52) U.S. Cl.
CPC ... *G01R 31/318536* (2013.01); *G01R 31/318519* (2013.01); *G01R 31/318552* (2013.01)
USPC .............. 714/726; 714/733; 714/742; 714/30

(58) Field of Classification Search
CPC .............................................. G01R 13/318536
USPC .......................................... 714/726, 733, 30
See application file for complete search history.

(56) References Cited

U.S. PATENT DOCUMENTS

| | | | |
|---|---|---|---|
| 5,524,114 A | 6/1996 | Peng | |
| 6,327,684 B1 | 12/2001 | Nadeau-Dostie et al. | |
| 6,467,044 B1 | 10/2002 | Lackey | |
| 6,625,784 B1 * | 9/2003 | Ohta et al. | 716/136 |
| 7,120,214 B2 * | 10/2006 | Takata | 375/354 |
| 7,240,266 B2 * | 7/2007 | Farmer et al. | 714/731 |
| 7,284,143 B2 * | 10/2007 | Song et al. | 713/503 |
| 7,380,189 B2 | 5/2008 | Konuk | |
| 7,509,549 B2 * | 3/2009 | Larson et al. | 714/726 |
| 7,836,370 B2 | 11/2010 | Satoi et al. | |
| 8,127,188 B2 * | 2/2012 | Hasegawa | 714/731 |
| 8,140,925 B2 * | 3/2012 | Bellofatto et al. | 714/731 |
| 8,214,704 B1 * | 7/2012 | Bertanzetti | 714/729 |
| 2009/0187801 A1 | 7/2009 | Pandey | |

OTHER PUBLICATIONS

C. Metra et al., "New Design for Testability Approach for Clock Fault Testing," IEEE Transactions on Computers, Apr. 2012, pp. 448-457, vol. 61, No. 4.

(Continued)

*Primary Examiner* — Esaw Abraham
(74) *Attorney, Agent, or Firm* — Duft Bornsen & Fettig LLP

(57) ABSTRACT

An integrated circuit comprises scan test circuitry and additional circuitry subject to testing utilizing the scan test circuitry. The scan test circuitry comprises a scan chain having a plurality of scan cells. The integrated circuit further comprises a clock distribution network configured to provide clock signals to respective portions of the integrated circuit. The clock distribution network comprises at least one clock module comprising one or more clock dividers and associated clock divider logic, and the scan test circuitry is configured to permit testing of at least a portion of the clock divider logic. A given scan chain of the scan test circuitry may comprise first and second scan cells, with the first scan cell having a scan output coupled to a scan input of the second scan cell, and the second scan cell having a data input driven by an output of the clock divider logic.

20 Claims, 6 Drawing Sheets

(56) References Cited

OTHER PUBLICATIONS

Y. Higami et al., "Fault Simulation and Test Generation for Clock Delay Faults," 16th Asia and South Pacific Design Automation Conference (ASP-DAC), Jan. 2011, pp. 799-805, Yokohama, Japan.

X. Lin et al., "Test Generation for Designs with On-Chip Clock Generators," Asian Test Symposium (ATS), Nov. 2009, pp. 411-417.

C. Metra et al., "Novel Approach to Clock Fault Testing for High Performance Microprocessors," IEEE Very Large Scale Integration (VLSI) Test Symposium, May 2007, pp. 441-446.

T.L. McLaurin et al., "Enhanced Testing of Clock Faults," IEEE International Test Conference (ITC), Paper 31.2, Oct. 2007, pp. 1-9.

C. Metra et al., "Implications of Clock Distribution Faults and Issues with Screening Them During Manufacturing Testing," IEEE Transactions on Computers, May 2004, pp. 531-546, vol. 53, No. 5.

U.S. Appl. No. 13/280,797 filed in the name of R.C. Tekumalla et al. on Oct. 25, 2011 and entitled "Dynamic Clock Domain Bypass for Scan Chains."

* cited by examiner

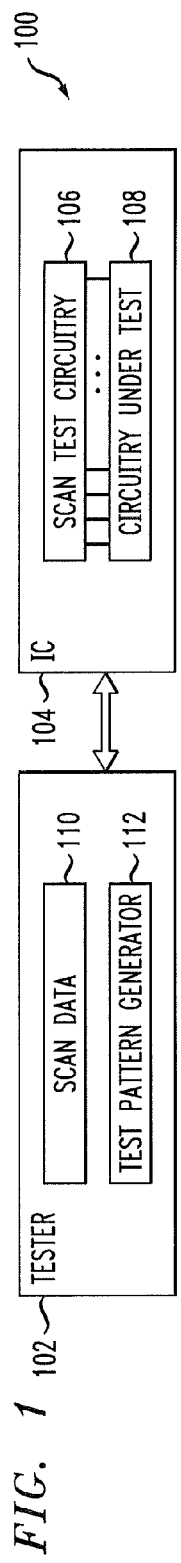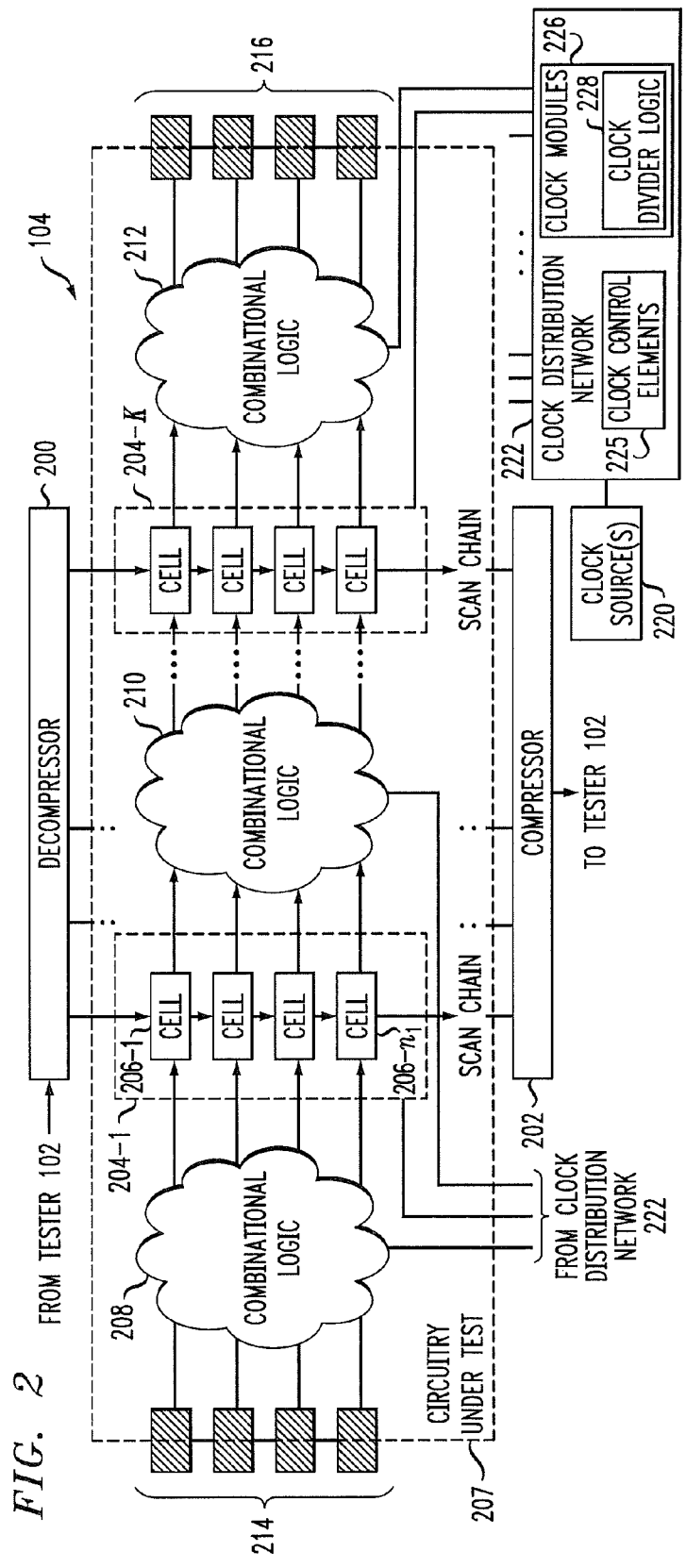
FIG. 1
FIG. 2

AT-SPEED SCAN TESTING OF CLOCK DIVIDER LOGIC IN A CLOCK MODULE OF AN INTEGRATED CIRCUIT

FIELD

The field relates generally to integrated circuits, and more particularly to scan testing of integrated circuits.

BACKGROUND

Integrated circuits are often designed to incorporate scan test circuitry that facilitates testing for various internal fault conditions. Such scan test circuitry typically comprises scan chains comprising multiple scan cells. The scan cells may be implemented, by way of example, utilizing respective flip-flops. The scan cells of a given scan chain are configurable to form a serial shift register for applying test patterns at inputs to combinational logic of the integrated circuit. The scan cells of the given scan chain are also used to capture outputs from other combinational logic of the integrated circuit.

Scan testing of an integrated circuit may therefore be viewed as being performed in two repeating phases, namely, a scan shift phase in which the flip-flops of the scan chain are configured as a serial shift register for shifting in and shifting out of test patterns, and a scan capture phase in which the flip-flops of the scan chain capture combinational logic outputs. These two repeating scan test phases may be collectively referred to herein as a scan test mode of operation of the integrated circuit, or as simply a scan mode of operation. Outside of the scan test mode and its scan shift and scan capture phases, the integrated circuit may be said to be in a functional mode of operation. Other definitions of the scan test and functional operating modes may also be used.

Integrated circuits commonly include multiple clock domains. In an integrated circuit of this type, different portions of the integrated circuit are provided with different clock signals via a clock distribution network.

SUMMARY

In one embodiment, an integrated circuit comprises scan test circuitry and additional circuitry subject to testing utilizing the scan test circuitry. The scan test circuitry comprises a scan chain having a plurality of scan cells. The integrated circuit further comprises a clock distribution network configured to provide clock signals to respective portions of the integrated circuit. The clock distribution network comprises at least one clock module comprising one or more clock dividers and associated clock divider logic. The scan test circuitry is configured to permit testing of at least a portion of the clock divider logic.

By way of example only, a given scan chain of the scan test circuitry may comprise first and second scan cells, with the first scan cell having a scan output coupled to a scan input of the second scan cell, and the second scan cell having a data input driven by an output of a designated portion of the clock divider logic. In an arrangement of this type, the scan test circuitry may be configured to provide in a scan shift phase of a scan test mode of operation a first signal path that passes through the first and second scan cells and bypasses the clock divider logic, and to provide in a capture phase of the scan test mode of operation a second signal path that passes through the clock divider logic and the second scan cell.

Such an embodiment allows clock divider logic to be scan tested using at-speed clock signals, thereby providing significantly improved fault coverage of the integrated circuit. This improved fault coverage is achieved with only minimal additional scan test circuitry and no adverse performance impact on functional operation.

Other embodiments of the invention include but are not limited to methods, apparatus, systems, processing devices and computer-readable storage media having computer program code embodied therein.

BRIEF DESCRIPTION OF THE DRAWINGS

FIG. 1 is a block diagram showing an integrated circuit testing system comprising a tester and an integrated circuit under test in one embodiment.

FIG. 2 shows a more detailed view of a portion of the integrated circuit in the testing system of FIG. 1.

DETAILED DESCRIPTION

Figure 3:
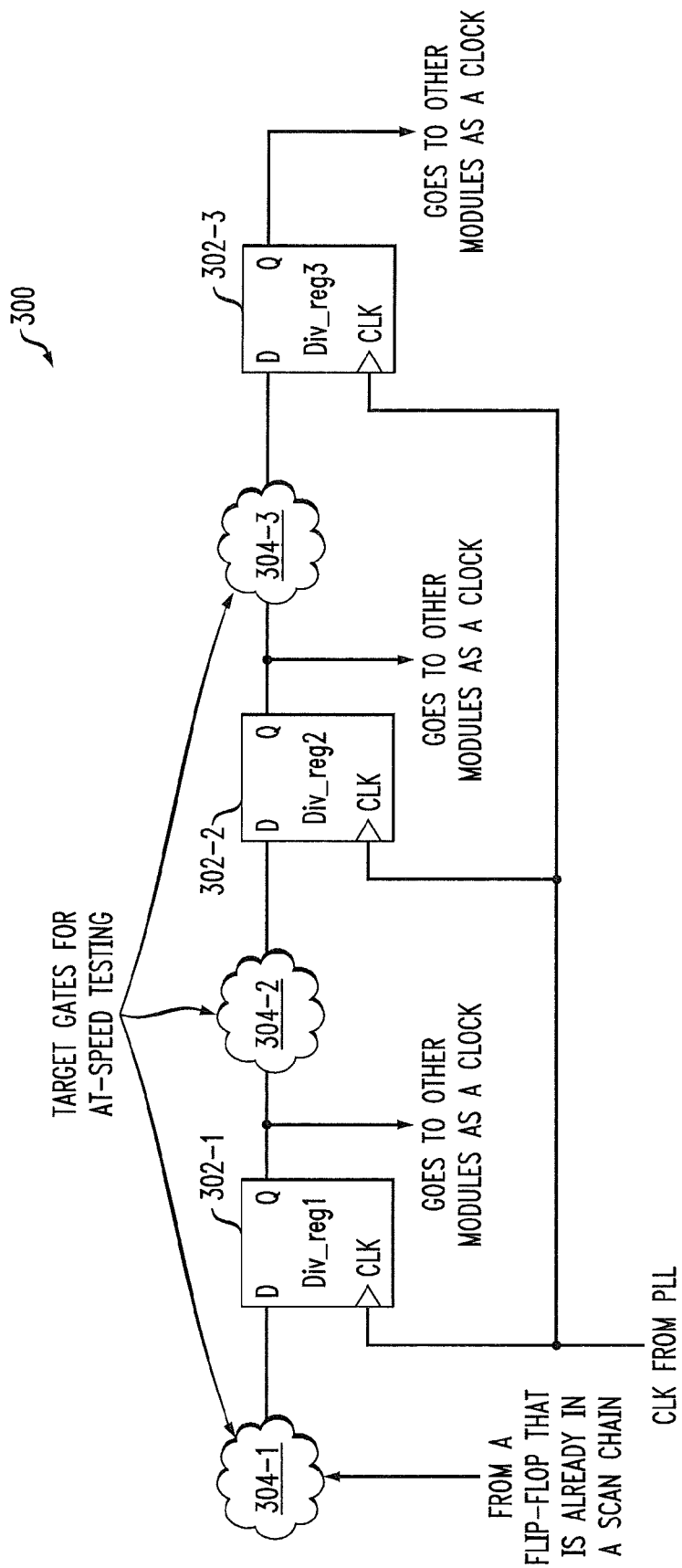
FIGS. 3, 4 and 5 illustrate insertion of scan test circuitry in a clock module of an integrated circuit in one embodiment.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide improved fault coverage by providing scan test circuitry for clock divider logic of a clock module of an integrated circuit.

FIG. 1 shows an embodiment of the invention in which a testing system 100 comprises a tester 102 and an integrated circuit under test 104. The integrated circuit 104 comprises scan test circuitry 106 coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104, as in a built-in self-test (BIST) arrangement.

The test pattern generator 112 may be implemented as an automatic test pattern generator (ATPG), and may be viewed as an example of what is more generally referred to herein as a test generation tool.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

The integrated circuit 104 may be configured for installation on a circuit board or other mounting structure in a computer, server, mobile telephone or other type of communication device. Such communication devices may also be viewed as examples of what are more generally referred to herein as "processing devices." The latter term is also intended to encompass storage devices, as well as other types of devices comprising data processing circuitry.

Embodiments of the present invention may be configured to utilize compressed or noncompressed scan testing, and embodiments of the invention are not limited in this regard. However, the embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where k=1, 2, ... K.

Each of the scan chains 204 comprises a plurality of scan cells 206. A scan shift control signal is utilized to cause the scan cells 206 of at least a given one of the scan chains 204 to form a serial shift register during scan testing. The scan shift control signal may comprise, for example, a scan enable (SE) signal, such that the scan cells of the given scan chain form the serial shift register responsive to the SE signal being at a first designated logic level (e.g., a logic "1" level) and the scan cells capture functional data when the SE signal is at a second designated logic level (e.g., a logic "0" level). A single SE signal may be used to control all of the scan chains 204, or only a subset of those scan chains, with the remaining scan chains being controlled using one or more other SE signals.

The SE signal in the present embodiment controls configuration of scan cells of a scan chain to form a serial shift register for shifting in and shifting out of scan test data associated with one or more test patterns applied by the tester 102. The SE signal may therefore be considered a type of scan shift enable signal, or more generally, a type of scan shift control signal.

When the scan chains 204 are configured to form respective serial shift registers for shifting in and shifting out scan test data associated with one or more test patterns applied by the tester 102, the scan test circuitry may be said to be in a scan shift phase of a scan test mode of operation. It should be appreciated, however, that a wide variety of other types of scan shift control signals and sets of integrated circuit operating modes and phases may be used in other embodiments. These embodiments therefore do not require the use of any particular definition of operating modes and phases.

The scan chains 204 may be associated with multiple distinct clock domains, or a single clock domain. It will be assumed in some embodiments that at least one of the scan chains 204 is a multiple clock domain scan chain, that is, a scan chain comprising sub-chains associated with respective distinct clock domains. Such sub-chains of a multiple clock domain scan chain may be separated from one another by lockup latches. Also, one or more of the sub-chains may be selectively bypassed using clock domain bypass circuitry so as to not be part of the serial shift register formed by the scan chain in the scan shift phase. For example, such clock domain bypass circuitry may be configured to bypass one or more of the sub-chains that are determined to be inactive for a particular test pattern, and the clock domain bypass circuitry may bypass different ones of the sub-chains for different test patterns. Additional details regarding clock domain bypass circuitry that may be utilized in embodiments of the invention may be found in U.S. patent application Ser. No. 13/280,797, filed Oct. 25, 2011 and entitled "Dynamic Clock Domain Bypass for Scan Chains," which is commonly assigned herewith and incorporated by reference herein.

The scan chains 204 are generally arranged in parallel with one another between respective outputs of the decompressor 200 and respective inputs of the compressor 202, such that in the scan shift phase of the scan test mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In some embodiments of the invention, the lengths of the scan chains 204 are balanced so that the same amount of time is needed to shift a desired set of scan test patterns into all of the scan chains. It may therefore be assumed without limitation that all of the scan chains 204 are of the same length n, such that $n_1=n_2= \ldots =n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading data from and writing data to one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift phase of the scan test mode of operation. The compressor 202 of the scan test circuitry 106 receives scan test output data shifted out of the scan chains 204, also when such chains are configured as respective serial shift registers in the scan shift phase of the scan test mode of operation, and compresses that scan test output data for delivery back to the tester 102.

Compressed scan input data is applied by tester 102 to M scan inputs of decompressor 200, and compressed scan output data is provided from compressor 202 back to tester 102 via M scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift phase of a scan test mode of operation of the integrated circuit 104 and also to capture functional data from combinational logic elements. The capture of functional data may be said to occur in a capture phase of the scan test mode. Again, other arrangements of operating modes and phases may be used in other embodiments.

The number K of scan chains 204 is generally much larger than the number M of decompressor inputs or compressor outputs. The ratio of K to M provides a measure of the degree of scan test pattern compression provided in the scan test circuitry 106. It should be noted, however, that the number of compressor outputs need not be the same as the number of decompressor inputs. For example, there may be M decompressor inputs and P compressor outputs, where M≠P but both M and P are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in U.S. Pat. No. 7,831,876, entitled "Testing a Circuit with Compressed Scan Subsets," which is commonly assigned herewith and incorporated by reference herein. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern. As noted above, such scan shift phases may be viewed as being part of a scan test mode of operation of the integrated circuit 104.

In the FIG. 2 embodiment, the integrated circuit 104 comprises one or more clock sources 220 coupled to a clock distribution network 222 that is configured to provide a plurality of clock signals to respective portions of the integrated circuit 104. A given "portion" of an integrated circuit as that term is used herein is intended to be broadly construed, and should be understood to encompass any circuit element or other identifiable component, or set of such elements or other components, that are implemented within the integrated circuit. For example, the clock distribution network in the present embodiment provides clock signals to the scan chains 204 and to the combinational logic blocks 208, 210 and 212. The clock distribution network 222 further comprises clock control elements 225 that are arranged in respective selected clock signal lines of at least one clock tree or other portion of the clock distribution network 222.

The clock distribution network 222 further comprises a plurality of clock modules 226 each comprising one or more clock dividers and associated clock divider logic, the latter being illustratively shown as clock divider logic 228. Although multiple clock modules are shown in the present embodiment, other embodiments may include only a single clock module. Accordingly, the term "clock distribution network" as used herein is intended to be broadly construed, and the particular arrangement shown in FIG. 2 is exemplary only. In other embodiments, for example, a clock distribution network may comprise one or more of the clock sources 220.

Also, although the clock distribution network 222 is shown as a separate block in FIG. 2, portions of that network may be distributed throughout the integrated circuit 104, as will be appreciated by those skilled in the art.

A given clock divider of a particular clock module 226 of the clock distribution network 222 is configured to generate at least one clock signal by dividing down an input clock signal using one or more clock divider flip-flops. The input clock signal may be received from a particular clock source 220, such as a phase-locked loop (PLL) implemented within the integrated circuit 104. Numerous other types of clock sources and clock modules may be used in other embodiments.

The term "clock module" as that term is broadly utilized herein is intended to encompass, for example, circuitry comprising one or more clock divider flip-flops as well as the associated clock divider logic 228. In conventional practice, the clock divider logic of the clock module is typically not subject to at-speed scan testing. This is due at least in part to the fact that it is generally not possible to include the clock divider flip-flops themselves in a scan chain without disturbing the desired scan operation. Instead, the clock divider logic often either goes completely untested or is tested only for stuck-at faults using a low-speed clock. Accordingly, at-speed delay faults in the clock divider logic can go undetected, leading to reduced yield and possible failures in the field.

These issues are addressed in the present embodiment by configuring the scan test circuitry 106 to permit testing of at least a portion of the clock divider logic 228. The clock divider logic 228 in such an embodiment is therefore considered part of the "additional circuitry" subject to testing utilizing the scan test circuitry 106. The clock divider logic 228 is more particularly considered part of the circuitry under test 207 in the FIG. 2 embodiment, although not expressly illustrated as such in the figure.

By way of example, a given scan chain 204 of the scan test circuitry 106 includes first and second scan cells 206, with the first scan cell having a scan output coupled to a scan input of the second scan cell, and the second scan cell having a data input driven by an output of a designated portion of the clock divider logic 228. In an arrangement of this type, the scan test circuitry may be configured to provide in a scan shift phase of a scan test mode of operation a first signal path that passes through the first and second scan cells 206 and bypasses the clock divider logic 228, and to provide in a capture phase of the scan test mode of operation a second signal path that passes through the clock divider logic 228 and the second scan cell.

At least one of the clock control elements 225 is configured to select one of a plurality of clock signals for application to clock inputs of the first and second scan cells in conjunction with the scan testing of the clock divider logic 228. The plurality of clock signals may include, for example, an at-speed clock signal for at-speed testing of the clock divider logic 228 and a slower clock signal for stuck-at fault testing of the clock divider logic 228. Other types of selection among multiple clock signals can be provided using one or more such clock control elements 225. Another example of one possible implementation of a given clock control element 225 will be described below in conjunction with FIG. 6.

The clock distribution network 222 is therefore configured to allow the clock divider logic 228 to be scan tested using an at-speed clock signal, thereby providing significantly improved fault coverage of the integrated circuit 104. This improved fault coverage is achieved with only minimal additional scan test circuitry and no adverse performance impact on functional operation.

The manner in which portions of the scan test circuitry 106 are inserted in or otherwise associated with a given one of the clock modules 226 will now be described in greater detail with reference to FIGS. 3, 4 and 5.

Referring initially to FIG. 3, a portion 300 of the given clock module 226 prior to insertion of scan test circuitry comprises a plurality of clock dividers 302 and associated clock divider logic comprising a plurality of combinational logic blocks 304 that include target gates for at-speed testing. The combinational logic blocks 304 are assumed to be part of the clock divider logic 228.

The clock dividers 302 in this embodiment are illustratively implemented as a first clock divider flip-flop 302-1, a second clock divider flip-flop 302-2 and a third clock divider flip-flop 302-3, also denoted Div_reg1, Div_reg2 and Div_reg3, respectively. Each of these clock divider flip-flops has a data input D, a data output Q and a clock signal input CLK.

The data input D of the first clock divider flip-flop 302-1 is driven by an output of a first combinational logic block 304-1 of the clock divider logic 228. The data output Q of the first clock divider 302-1 drives the data input D of the second clock divider flip-flop 302-2 via a second combinational logic block 304-2 of the clock divider logic 228. Similarly, the data output Q of the second clock divider 302-2 drives the data input D of the third clock divider flip-flop 302-3 via a third combinational logic block 304-3 of the clock divider logic 228. The first combinational logic block 304-1 in this embodiment is driven by a flip-flop or other scan cell 206 that is already part of one of the scan chains 204.

The CLK input of each clock divider flip-flop receives the same input clock signal from a PLL that represents one of the clock sources 220 of FIG. 2. The Q output of each of the clock divider flip-flops represents a different divided-down version of the input clock signal and is provided as a clock to other modules or portions of the integrated circuitry 104 via one or more clock trees of the clock distribution network 222.

Any of a wide variety of different input clock division arrangements may be implemented by appropriate configuration of the number and type of clock divider flip-flops, as required to meet the clock signaling requirements of a given design. For example, the Q outputs of the clock divider flip-flops 302-1, 302-2 and 302-3 in the FIG. 3 embodiment may provide a divide-by-2 of the PLL clock, a divide-by-4 of the PLL clock, and a divide-by-8 of the PLL clock, respectively. In this example, each clock divider flip-flop divides its data input by a factor of two. Numerous alternative arrangements may be used in a given one of the clock modules 226, including arrangements involving more than or fewer than the three exemplary clock dividers shown in FIG. 3.

Figure 4:
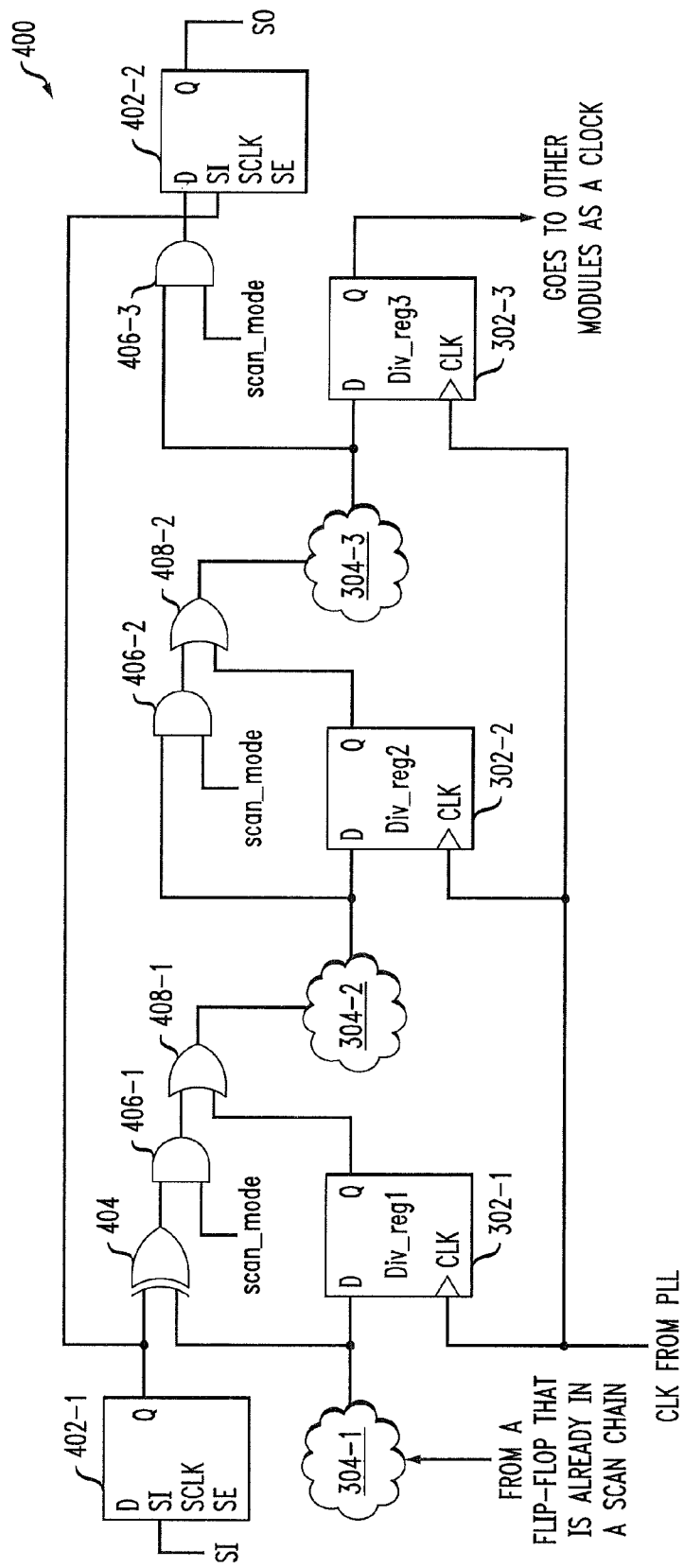

FIG. 4 shows the manner in which portions of scan test circuitry 106 are inserted in or otherwise associated with the portion 300 of the clock module 226 of FIG. 3. The circuitry 400 in this embodiment includes the clock divider flip-flops 302 and combinational logic blocks 304 as previously described. The circuitry 400 also includes portions of the scan test circuitry 106 including first and second scan cells 402-1 and 402-2 and first through sixth additional logic gates. The first through sixth additional logic gates in this embodiment more particularly comprise an XOR gate 404, an AND gate 406-1, an OR gate 408-1, an AND gate 406-2, an OR gate 408-2, and an AND gate 406-3, respectively. Other types and numbers of logic gates may be used in other embodiments.

The first and second scan cells 402-1 and 402-2 are assumed to comprise respective consecutive scan cells 206 of one of the scan chains 204 of the scan test circuitry 106. Each of the scan cells 402-1 and 402-2 has a data input D, a data output Q, a scan input SI, a scan clock input SCLK and a scan enable input SE. The data output Q of a given scan cell in this embodiment also serves as a scan output, where the scan output is denoted SO. Accordingly, data output Q in this embodiment is also referred to herein as a scan output of the corresponding scan cell. In other embodiments, the scan cells 402-1 and 402-2 may each have a separate data output Q and scan output SO.

The first scan cell 402-1 has its Q output coupled to the scan input SI of the second scan cell 402-2, and the second scan cell 402-2 has its data input D driven by an output of a designated portion of the clock divider logic 228, namely, an output of the third combinational logic block 304-3 of the clock divider logic 228.

The scan input SI of the first scan cell 402-1 may be coupled to a scan output of a preceding scan cell of the same scan chain 204, or may be driven by an output of decompressor 200 if the scan cell 402-1 is an initial scan cell of that scan chain 204.

The scan clock SCLK applied to the clock inputs of the scan cells 402-1 and 402-2 is supplied by a clock control element 225, an example of which will be described below in conjunction with FIG. 6. This exemplary clock control element is configured to select between a shift clock and an at-speed capture clock.

The first logic gate comprising XOR gate 404 has a first input coupled to the scan output of the first scan cell 402-1 and a second input coupled to an output of the first combinational logic block 304-1 of the clock divider logic 228. The output of the first combinational logic block 304-1 is also coupled to the data input D of the first clock divider flip-flop 302-1.

The second logic gate comprising AND gate 406-1 has a first input coupled to an output of the XOR gate 404 and a second input adapted to receive a scan mode signal denoted scan_mode.

The third logic gate comprising OR gate 408-1 has a first input coupled to an output of the AND gate 406-1 and a second input coupled to the data output Q of the first clock divider flip-flop 302-1. An output of the OR gate 408-1 is coupled to an input of the second combinational logic block 304-2. An output of the second combinational logic block 304-2 is coupled to the data input D of the second clock divider flip-flop 302-2.

The fourth logic gate comprising AND gate 406-2 has a first input coupled to the output of the second combinational logic block 304-2 and a second input adapted to receive the scan_mode signal.

The fifth logic gate comprising OR gate 408-2 has a first input coupled to an output of the AND gate 406-2 and a second input coupled to an output of the second clock divider flip-flop 302-2. An output of OR gate 408-2 is coupled to an input of the third combinational logic block 304-3. An output of the third combinational logic block 304-3 is coupled to the data input D of the third clock divider flip-flop 302-3.

The sixth logic gate comprising AND gate 406-3 has a first input coupled to the output of the third combinational logic block 304-3 and a second input adapted to receive the scan_mode signal.

Figure 5:
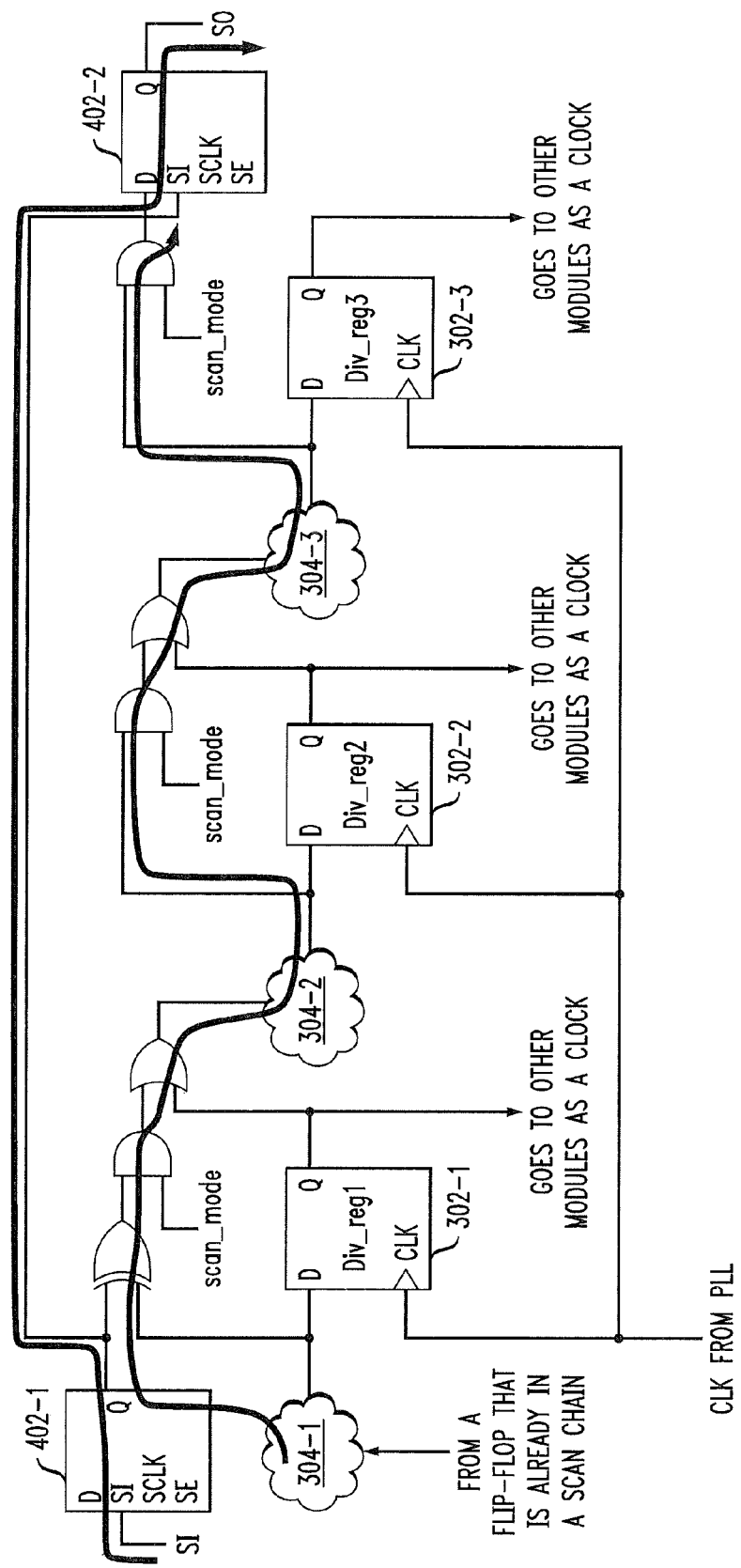

FIG. 5 illustrates the different signal paths provided through the circuitry 400 in scan shift and capture phases of a scan test mode of operation of the integrated circuit 104. It is assumed without limitation that the scan_mode signal is at a logic high level during the scan test mode of operation and at a logic low level during a functional mode of operation of the integrated circuit 104.

In the scan shift phase of the scan test mode of operation, a first signal path denoted by the upper path line is activated.

This first signal path passes through the first and second scan cells 402-1 and 402-2 and bypasses the combinational logic blocks 304 of the clock divider logic 228.

In the capture phase of the scan test mode of operation, a second signal path denoted by the lower path line is activated. This second signal path passes through the combinational logic blocks 304 of the clock divider logic 228, thereby allowing output values of these combinational logic blocks to be captured by the second scan cell 402-2 and subsequently shifted out through the corresponding scan chain 204.

If a given one of the clock modules 226 comprises multiple sets of one or more clock dividers, different pairs of first and second scan cells 402-1 and 402-2 may be associated with each such set, with the scan output of the second scan cell in a first pair of scan cells being coupled to the scan input of the first scan cell in the next pair, and so on for each pair of scan cells associated with each set of clock dividers, with the scan output of the second scan cell in the final pair being provided to a scan input of a subsequent scan cell or to an input of the compressor 202. Thus, the various pairs of first and second scan cells may be combined into a single one of the scan chains 204.

In the embodiments described in conjunction with FIGS. 3 through 5, the combinational logic blocks 304 of the clock divider logic 228 are subject to at-speed testing using a fast functional clock. This increases fault coverage of the clock module 226. This enhanced scan testing functionality is provided without any significant impact on functional performance, and requires only minimal additional scan test circuitry.

It should be noted that the clock dividers 302 in these embodiments are not scanned, but all associated clock divider logic 228 is subject to at-speed scan testing. The term "clock divider logic" as broadly used herein is intended to refer to logic circuitry that is associated with clock division in a clock module but excludes clock divider flip-flops or other clock dividers not appropriate for scan testing.

Figure 6:
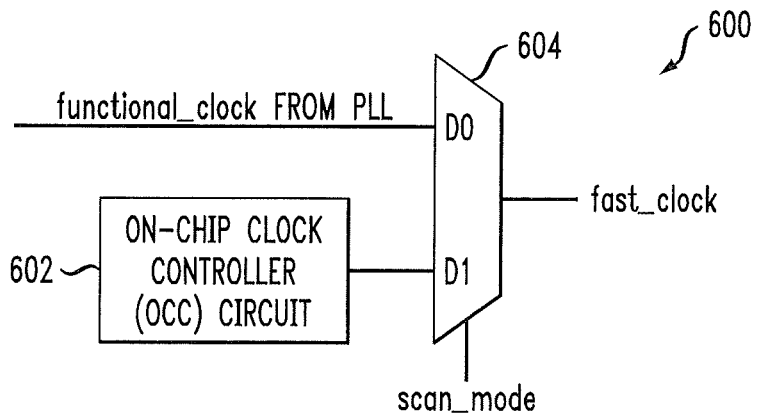
FIG. 6 shows an exemplary clock control element of the integrated circuit of FIG. 1.

FIG. 6 shows an exemplary clock control element 600 that is used to control selection between different clocks in conjunction with scan testing of the clock divider logic 228. The clock control element 600 represents a particular one of the clock control elements 225 of the clock distribution network 222. In this embodiment, the clock control element 600 is configured to multiplex between a functional clock signal and a scan capture clock signal responsive to a scan mode signal.

The exemplary clock control element 600 as illustrated in the figure comprises an on-chip clock controller (OCC) circuit 602 and a two-to-one multiplexer 604. A functional clock signal denoted functional_clock and supplied by the above-noted PLL is applied to a D0 input of the multiplexer 604. A scan capture clock signal comprising a plurality of at-speed scan capture clock pulses generated by the OCC circuit 602 is applied to a D1 input of the multiplexer 604. The output of the multiplexer 604 is an at-speed clock signal denoted fast_clock. A select signal input of the multiplexer 604 is driven by the above-noted scan_mode signal, which as described previously is illustratively at a logic high level during a scan test mode of operation of the integrated circuit 104 and at a logic low level during a functional mode of operation of the integrated circuit 104.

If scan_mode is at a logic high level, indicating that the integrated circuit is in a scan test mode of operation, the at-speed scan capture pulses from OCC circuit 602 are passed through to the fast_clock output of multiplexer 604. Otherwise, the integrated circuit is in a functional mode of operation, scan_mode is at a logic low level, and the functional_clock is passed to the fast_clock output.

It is to be appreciated that the particular circuitry arrangements shown in FIGS. 1-6 are presented by way of illustrative example only, and numerous alternative arrangements of scan test circuitry, clock distribution networks, clock control elements, clock modules, clock dividers and associated clock divider logic, and possibly additional or alternative elements, may be used to implement the described functionality. This functionality can be implemented in one or more of the embodiments without any significant negative impact on integrated circuit area requirements or functional timing requirements.

The presence of scan test functionality for clock divider logic 228 within integrated circuit 104 may be made apparent to a test pattern generator or other test generation tool so that the tool can take that functionality into account in generating test patterns. In order to accomplish this, one or more input files describing the operation of this circuitry may be provided to the test generation tool.

Figure 7:
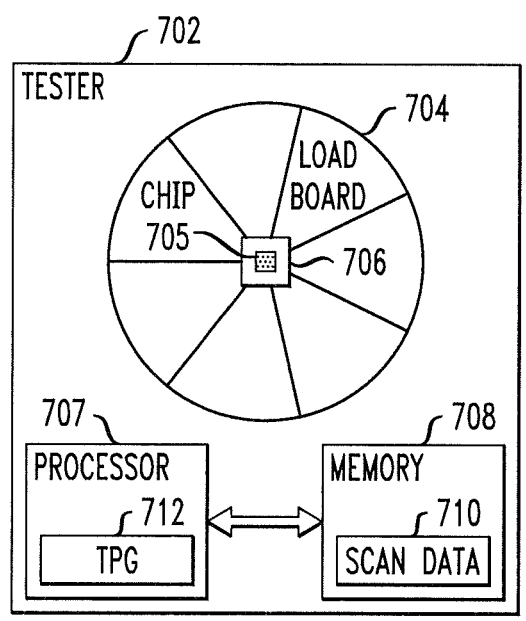
FIG. 7 shows one possible implementation of the testing system of FIG. 1.

The tester 102 in the testing system 100 of FIG. 1 need not take any particular form, and various conventional testing system arrangements can be modified in a straightforward manner to support the scan testing of clock divider logic as disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored program code. In the present embodiment, processor 707 is shown as implementing a test pattern generator 712, which may be implemented as an ATPG. Associated scan data 710 is stored in memory 708. Numerous alternative testers may be used to perform scan testing of an integrated circuit as disclosed herein. Also, as indicated previously, in alternative embodiments at least portions of the tester 702 may be incorporated into the integrated circuit itself, as in BIST arrangement.

Figure 8:
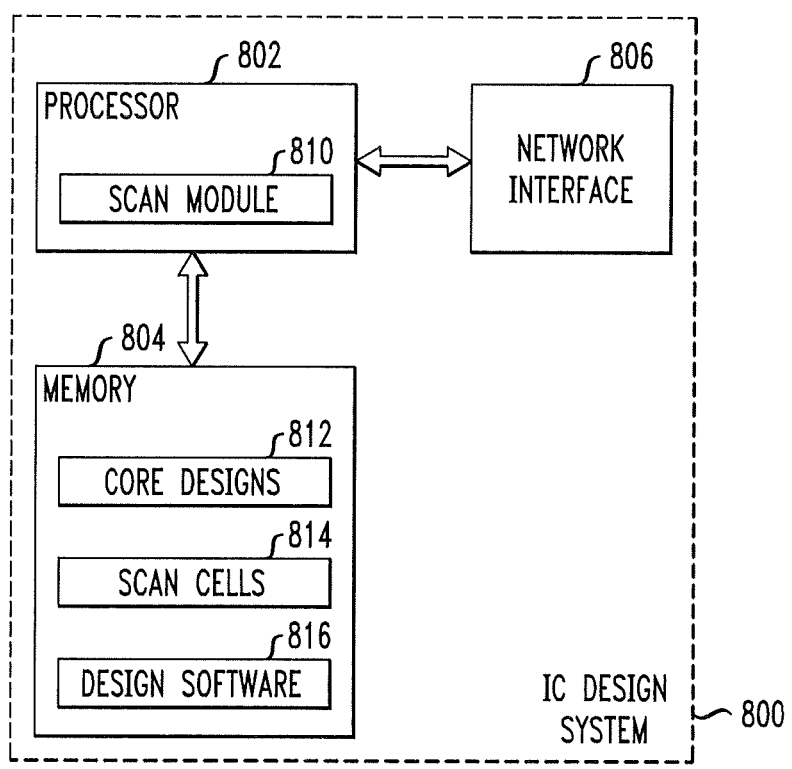
FIG. 8 is a block diagram of a processing system for generating an integrated circuit design comprising at least one clock module comprising scan test circuitry of the type illustrated in FIGS. 4 and 5.

The insertion of scan test circuitry 106 of a given integrated circuit design may be performed in a processing system 800 of the type shown in FIG. 8. Such a processing system in this embodiment more particularly comprises a design system configured for use in designing integrated circuits such as integrated circuit 104 to include scan chains 204 and other scan test circuitry for supporting scan testing of clock divider logic 228.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated clock control elements in the manner disclosed herein, in conjunction with utilization of integrated circuit design software 816.

By way of example, the scan chain circuitry 106 comprising scan chains 204 and associated clock control elements 225 may be generated in system 800 using an RTL description and then synthesized to gate level using a specified technology library. A test generation model may then be created for generating test patterns using a test generation tool. Control files or other types of input files may be used to provide the test generation tool with information such as the particular scan chain portions that are driven by clock signals of particular clock domains in a given embodiment. Once the corresponding rules are in place, a rule checker may be run so that the test generation tool has visibility of the scan chains taking into account the operation of the clock control elements permitting at-speed testing of the clock divider logic 228. Test patterns may then be generated for the scan chain circuitry.

Elements such as 810, 812, 814 and 816 are implemented at least in part in the form of software stored in memory 804 and processed by processor 802. For example, the memory 804 may store program code that is executed by the processor 802 to implement particular scan testing functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices. The memory 708 of FIG. 7 may be viewed as another illustrative example of a computer program product as the latter term is used herein.

As indicated above, embodiments of the invention may be implemented in the form of integrated circuits. In a given such integrated circuit implementation, identical die are typically formed in a repeated pattern on a surface of a semiconductor wafer. Each die includes scan test circuitry, a clock distribution network, clock modules and clock control elements, and may include other structures or circuits. The individual die are cut or diced from the wafer, then packaged as an integrated circuit. One skilled in the art would know how to dice wafers and package die to produce integrated circuits. Integrated circuits so manufactured are considered embodiments of this invention.

It should again be emphasized that the embodiments of the invention as described herein are intended to be illustrative only. For example, other embodiments of the invention can be implemented using a wide variety of other types of scan test circuitry, with different types and arrangements of scan cells, as well as different types and arrangements of clock distribution networks, clock control elements, clock modules, clock dividers, clock divider logic and control signaling, than those included in the embodiments described herein. These and numerous other alternative embodiments within the scope of the following claims will be readily apparent to those skilled in the art.

What is claimed is:

1. An integrated circuit comprising:
    scan test circuitry comprising at least one scan chain having a plurality of scan cells;
    additional circuitry subject to testing utilizing the scan test circuitry; and
    a clock distribution network configured to provide a plurality of clock signals to respective portions of the integrated circuit;
    the clock distribution network comprising:
    at least one clock module comprising one or more clock dividers and associated clock divider logic;
    wherein the scan test circuitry is coupled to the clock distribution network and configured to permit testing of at least a portion of the associated clock divider logic of the at least one clock module.

2. The integrated circuit of claim 1 wherein a given scan chain of the scan test circuitry comprises:
    a first scan cell; and
    a second scan cell;
    the first scan cell having a scan output coupled to a scan input of the second scan cell;
    the second scan cell having a data input driven by an output of a designated portion of the clock divider logic.

3. The integrated circuit of claim 2 wherein the scan test circuitry further comprises:
    a first logic gate having a first input coupled to the scan output of the first scan cell and a second input coupled to an output of first logic circuitry of the clock divider logic; and
    a second logic gate having a first input coupled to an output of the first logic gate and a second input adapted to receive a scan mode signal.

4. The integrated circuit of claim 3 wherein the scan test circuitry further comprises a third logic gate having a first input coupled to an output of the second logic gate and a second input coupled to an output of a first clock divider.

5. The integrated circuit of claim 4 wherein the first logic gate comprises an XOR gate, the second logic gate comprises an AND gate, and the third logic gate comprises an OR gate.

6. The integrated circuit of claim 4 wherein the clock module comprises at least the first clock divider and a second clock divider and the clock divider logic comprises at least the first logic circuitry and second logic circuitry, the output of the first logic circuitry being coupled to an input of the first clock divider, the second logic circuitry having an input coupled to an output of the third logic gate and an output coupled to an input of the second clock divider.

7. The integrated circuit of claim 6 wherein the scan test circuitry further comprises a fourth logic gate having a first input coupled to the output of the second logic circuitry and a second input adapted to receive the scan mode signal.

8. The integrated circuit of claim 7 wherein the scan test circuitry further comprises a fifth logic gate having a first input coupled to an output of the fourth logic gate and a second input coupled to an output of a second clock divider.

9. The integrated circuit of claim 8 wherein the clock module comprises at least the first clock divider, the second clock divider and a third clock divider and the clock divider logic comprises at least the first logic circuitry, the second logic circuitry and third logic circuitry, the third logic circuitry having an input coupled to an output of the fifth logic gate and an output coupled to an input of the third clock divider.

10. The integrated circuit of claim 9 wherein the scan test circuitry further comprises a sixth logic gate having a first input coupled to the output of the third logic circuitry and a second input adapted to receive the scan mode signal.

11. The integrated circuit of claim 10 wherein the fourth logic gate comprises an AND gate, the fifth logic gate comprises an OR gate, and the sixth logic gate comprises an AND gate.

12. The integrated circuit of claim 2 wherein the clock distribution network comprises a clock control element configured to select one of a plurality of clock signals for application to clock inputs of the first and second scan cells.

13. The integrated circuit of claim 12 wherein the plurality of clock signals includes an at-speed clock signal for at-speed testing of the clock divider logic and a slower clock signal for stuck-at fault testing of the clock divider logic.

14. The integrated circuit of claim 2 wherein the scan test circuitry is configured to provide in a scan shift phase of a scan test mode of operation a first signal path that passes through the first and second scan cells and bypasses the clock divider logic and to provide in a capture phase of the scan test mode of operation a second signal path that passes through the clock divider logic and the second scan cell.

15. A processing device comprising the integrated circuit of claim 1.

16. A method comprising:
   providing clock signals to respective portions of an integrated circuit from at least one clock module comprising one or more clock dividers and associated clock divider logic; and
   configuring scan test circuitry of the integrated circuit to permit testing of at least a portion of the associated clock divider logic of the at least one clock module;
   wherein the scan test circuitry is coupled to a clock distribution network comprising the at least one clock module.

17. The method of claim 16 wherein configuring the scan test circuitry further comprises:
   providing a scan chain comprising at least a first scan cell and a second scan cell;
   coupling a scan output of the first scan cell to a scan input of the second scan cell; and
   driving a data input of the second scan cell with an output of a designated portion of the clock divider logic.

18. The method of claim 17 wherein configuring the scan test circuitry further comprises:
   providing in a scan shift phase of a scan test mode of operation a first signal path that passes through the first and second scan cells and bypasses the clock divider logic; and
   providing in a capture phase of the scan test mode of operation a second signal path that passes through the clock divider logic and the second scan cell.

19. A computer-readable storage medium having computer program code embodied therein for use in scan testing an integrated circuit, wherein the computer program code when executed causes the method of claim 16 to be performed.

20. A processing system comprising:
   a processor; and
   a memory coupled to the processor and configured to store information characterizing an integrated circuit design;
   wherein the processing system is configured to provide scan test circuitry and a clock distribution network within the integrated circuit design, the scan test circuitry comprising at least one scan chain having a plurality of scan cells, the clock distribution network being configured to provide a plurality of clock signals to respective portions of the scan test circuitry;
   the clock distribution network comprising:
   at least one clock module comprising one or more clock dividers and associated clock divider logic;
   wherein the scan test circuitry is coupled to the clock distribution network and configured to permit testing of at least a portion of the associated clock divider logic of the at least one clock module.

* * * * *